United States Patent [19]
Yoshimizu et al.

[11] Patent Number: 5,565,767
[45] Date of Patent: Oct. 15, 1996

[54] BASE SUBSTRATE OF MULTICHIP MODULE AND METHOD FOR INSPECTING THE SAME

[75] Inventors: Toshikazu Yoshimizu; Hideo Azumai, both of Suita, Japan

[73] Assignee: Mega Chips Corporation, Osaka, Japan

[21] Appl. No.: 13,845

[22] Filed: Feb. 5, 1993

[30] Foreign Application Priority Data

| Apr. 16, 1992 | [JP] | Japan | 4-125644 |
| Jun. 5, 1992 | [JP] | Japan | 4-171813 |
| Jun. 5, 1992 | [JP] | Japan | 4-171814 |

[51] Int. Cl.$^6$ ............................................. G01R 31/04
[52] U.S. Cl. ................................................ 324/158.1
[58] Field of Search ........................... 324/158.1, 73.1, 324/765, 756; 361/792, 749; 437/8; 174/252; 257/40, 48

[56] References Cited

U.S. PATENT DOCUMENTS

| 3,867,693 | 2/1975 | Saxenmeyer, Sr. | 324/756 |
| 4,508,981 | 4/1985 | Dorler et. al. | 307/542 |
| 4,720,671 | 1/1988 | Tada et al. | 324/158 R |
| 4,779,041 | 10/1988 | Williamson, Jr. | 324/537 |
| 5,280,237 | 1/1994 | Buks | 324/73.1 |

OTHER PUBLICATIONS

Keezer, "Bare Die Testing and MCM Probing Techniques", IEEE (1992), pp. 20–23.
Parker, "Bare Die Test", IEEE (1992), pp. 24–27.
Beiley et al., "Array Probe Card", IEEE (1992), pp. 28–31.
Hubacher; "Ensuring proper probe contact during the testing of Integrated circuit chips"; IBM Technical Disclosure Bulletin; vol. 15, No. 11; Apr. 1973.

*Primary Examiner*—Vinh P. Nguyen
*Attorney, Agent, or Firm*—Lowe, Price, LeBlanc & Becker

[57] ABSTRACT

A plurality of bare semiconductor IC chips are mounted on a base substrate. The base substrate and IC chips are sealed in a package to constitute a multichip module. Diodes are disposed on the base substrate so that an end of each diode is connected to a terminal for connecting each IC chip with said base substrate and the other end thereof is connected to a prescribed voltage. As a result, it is possible to inspect the base substrate by contacting probes only with a connecting pad between the base substrate and a package, to reduce the number of pins of a probe card, to produce a cheap probe card and to reduce a rate of imperfect contact between the probe card and an inspecting pad.

9 Claims, 14 Drawing Sheets

BASE SUBSTRATE OF MULTICHIP MODULE AND METHOD FOR INSPECTING THE SAME

FIELD OF THE INVENTION

The present invention relates to a semiconductor device called multichip module (hereinafter referred to as MCM) and, more particularly, to an improvement in the printed wiring board (also called as base substrate) for mounting an IC chip, so as to ease the inspection, and its inspecting method.

BACKGROUND OF THE INVENTIONS

In an MCM, a plurality of bear chips, namely IC chips which are not packaged, are mounted on a lead frame (in case of plastic package) or a base substrate (in case of ceramic package) and they are directly packaged in a package. This structure reduces inductances and capacitances because packages for respective chips are not required. The enhancement in the packaging density accomplished at the same time shortens wirings between chips, thereby to shorten the signal propagation delay time. Therefore, by employing the MCM, it is said that for a CPC module an operation at about 100 MHz is possible though it was impossible by a board mounting method. In such MCM, when high reliability is requested or anti-heating is required as in case of a CPU module of a work station and so on, it is general to employ a ceramic package, and when a low cost is intended, it is general to employ a plastic package.

FIG. 27 is a block diagram showing a general constitution of an MCM employing a ceramic package. As shown in FIG. 27, the MCM includes plural IC chips 203, a base substrate 202 as a printed wiring board on which the IC chips 203 are mounted and a package 201 accommodating the base substrate in its cavity part 201a. Each IC chip 203 and the base substrate 202 are connected by, for example, a wire bonding with such as an Al wire 204, flip chip bonding, or the like.

FIG. 28 shows an example of a pattern of the base substrate 205. The pattern of the base substrate includes a first type bonding pad 206 for connection between the base substrate 205 and the package, a second type bonding pad 208 for connection between each IC chip 207 and the base substrate 205, and a wiring pattern 209 connecting between these two type pads. As wirings of the base substrate 205, wirings between each bonding pad (hereinafter referred to as A-type pad) 206 for connection between the base substrate 205 and the package and each bonding pad (hereinafter referred to as B-type pad) 208 for connection between the base substrate 205 and the IC chip are patterned on the base substrate 205, as shown in FIG. 28. Also, as shown by 210 in FIG. 28, there are wirings between A-type pads, between B-type pads and among respective plural pads. The position on which each IC chip is mounted is shown in FIG. 28 with a broken line 207. When mounting is carried out by a wire bonding system, the bonding pad 206 is connected with an inner lead of the package by wire bonding and the bonding pad 208 is connected with a bonding pad of the IC chip by wire bonding.

FIG. 29 shows an example of a cross-sectional structure of the base substrate. In the base substrate, an insulating film 212 comprising $SiO_2$, $Si_3N_4$, polyimide or the like is formed on a substrate body 211 comprising silicon, ceramic, or the like, a wiring film is produced and patterned thereon, thereby forming a first wiring layer 213 comprising Al, Cu, Cr, or the like. Further, an inter-layer insulating film 214 comprising such as polyimide or $SiO_2$ is formed as well as contact holes are produced thereat. Plural wiring layers and inter-layer insulating films are similarly formed alternately, and at last, a protection layer 218 is formed as well as apertures for bonding pads are produced. In order to inspect goodness of the completed base substrate, breakage of wires, short-circuiting between wirings, a quantity of capacitance accompanying with wirings, and a wiring resistance are detected as shown in FIG. 30. In order to carry out these, probes 243 and 244 of a probe card are contacted on an A-type bonding pad 241 for connecting the base substrate and the package and a B-type bonding pad 242 for connecting the base substrate and the IC chip, and turned-on electricity test between these probes 243 and 244 is performed.

In this prior art base substrate of MCM constructed as described above, when wirings on the base substrate are inspected, it was necessary to carry out an electrical inspection in a state where both of the A-type bonding pad and the B-type bonding pad are touched by probes of a probe card.

By the way, in an MCM on which a chip of 32 bit RISC (Reduced Instruction Set Computer) CPU, a chip of FPU (Floating Point Processing Unit) and four chips of cache memory are mounted, for example, 250 pads are required for peripheral A-type pads, for example, 420 pads are required for chip connecting B-type pads, as a total sum of 180 pads for the CPU, 80 pads for the FPU, and 160 pads for four cache memories because 40 pads are required for each cache memory. This means that the whole base substrate requires as much as 670 pads. As a result, the probe card that can probe all these pads at one time should inevitably have a lot of pins as well as should have probes for B-type pads positioned inside the substrate in addition those for A-type pads at the periphery of the substrate, resulting in extreme difficulty in producing a probe card which is depending on hand-making process. Even if such a probe card is actually produced, the production cost thereof could be extremely high, which would result in an increase in the cost of the MCM itself. Further, the probability of generating faulty contacts of the probe card onto the bonding pad during inspecting the substrate may become higher with a larger number of pins due to obstacles attached to the bonding pads. In addition, a tester needs a long time for inspecting all the pads, also leading to a high cost. When plural probe cards each probing a divided group of pads are provided so as to enable inspection of all the pads as a whole, the cost would also be higher because plural probe cards are required. In addition, such construction requires plural times attachment work of the probe card to the tester or to employment of plural testers for inspecting a single MCM, which results in also a high cost and a complicated work for inspection.

SUMMARY OF THE INVENTION

It is an object of the present invention to provide a base substrate of an MCM and an inspecting method of the base substrate that can reduce the number of pins of a probe card for inspecting the base substrate and reduce the probability of arising faulty contact of the probe card onto a bonding pad as small as possible. This would result in a large reduction in the probability of erroneously judging good product as faulty one and also as a low cost probe card.

It is a further object of the present invention to provide the base substrate of MCM that can omit the process of cutting the short-circuiting substrate which is provided to ease the inspection process after completing the inspection of the base substrate.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

In the base substrate of MCM in accordance with the present invention, a diode is provided connected between an IC bonding pad formed on the base substrate and a node to be a predetermined voltage, namely, a ground node or a power supply voltage node, or further a terminal connecting a base substrate to a package is provided and this terminal is connected to a chip connection terminal by wirings. Or the chip connection terminals are mutually connected by wirings, or these mutually connected chip connection terminals are further connected to a base connection terminal by wirings. Therefore, the predetermined voltage is applied to the IC bonding pad from the diode, when a wiring between an A-type pad and the IC bonding pad is inspected. Thus, it is not necessary to make a probe of a probe card contact with the IC bonding pad and probes of the probe card which are to be made contacted with pads at the periphery of the base substrate or an inspecting pad are required.

In the base substrate of MCM in accordance with the present invention, the above-described diode is produced in the base substrate, thereby enabling to suppress an increase in cost for producing the base substrate due to providing the inspecting functions.

In an inspecting method for the base substrate of MCM in accordance with the present invention, since a diode is provided connected between an IC bonding pad formed on the base substrate and a node to be a predetermined voltage, namely, a ground node or a power supply voltage node, or further a terminal connecting a base substrate to a package is provided and this terminal is connected to a chip connection terminal by wirings, the chip connection terminals are mutually connected by wirings, or these mutually connected chip connection terminals are further connected to a base connection terminal by wirings, a probe card is contacted with only pads for mounting ICs formed on the base substrate in which a turned-on electricity inspecting diode is incorporated and goodness or badness of wirings on the base substrate is judged from a measured value of a current flowing through the diode, the inspection of the base substrate including the turned-on electricity inspecting diode can be carried out by contacting probes of the probe card only onto pads of the peripheral part of the base substrate. Therefore, it is possible to judge an existence of a wiring default of the base substrate and a kind thereof from a measured result of a current flowing through the diode.

In an inspecting method for the base substrate of MCM in accordance with the present invention, a diode connected between an IC bonding pad formed on the base substrate and a node to be a predetermined voltage as a ground node or a power supply voltage node is produced in the base substrate. Therefore, it is possible to suppress an increase in cost for producing the base substrate due to providing the inspecting functions.

In the base substrate of MCM in accordance with the present invention, a short-circuiting wiring is provided so as to make a plurality of wiring patterns formed on the base substrate as a group of wiring patterns electrically connected with each other, and the short-circuiting wirings are provided such that a fuse pattern constituting the short-circuit-ing wiring has a narrower portion and an aperture is provided at a portion of a protecting layer or an insulating layer provided on the fuse pattern, which portion corresponding to the narrower portion, to enable the fuse pattern to be cut after the inspecting the base substrate. Therefore, the group of plural wiring patterns which are electrically connected with each other can be tested as one unit and the number of pins of the probe card can be largely reduced.

In addition, in the base substrate of MCM in accordance with the present invention, a short-circuiting wiring pattern is provided at a part of the base substrate which is deleted in a dicing process and a process for cutting the fuse part of the short-circuiting wiring with such as a laser is realized automatically by the dicing process. Therefore, a desired circuit is obtained without a special cutting off process of the short-circuiting wiring.

In an inspecting method for the base substrate of MCM in accordance with the present invention, a short-circuiting wiring is provided so as to make a plurality of wiring patterns formed on the base substrate as a group of wiring patterns electrically connected with each other, and the short-circuiting wirings are provided such that a fuse pattern constituting the short-circuiting wiring has a narrower portion and an aperture is provided at a portion of a protecting layer or an insulating layer provided on the fuse pattern, which portion corresponding to the narrower portion to enable the fuse pattern to be cut after the inspecting the base substrate, and current value of the wiring patterns is measured by contacting a probe card with a terminal at the end part of each group of wiring patterns. Therefore, the group of plural wiring patterns which are electrically connected with each other can be tested as one unit and the number of pins of the probe card can be largely reduced.

DETAILED DESCRIPTION OF THE PREFERRED EMBODIMENT

Embodiments of the present invention will be described in detail with reference to the drawings.

FIGS. 1(a) to 1(d) schematically show arrangement of pads and wirings on a base substrate of an MCM in accordance with a first to a fourth embodiments of the present invention, respectively.

Figure 1A:
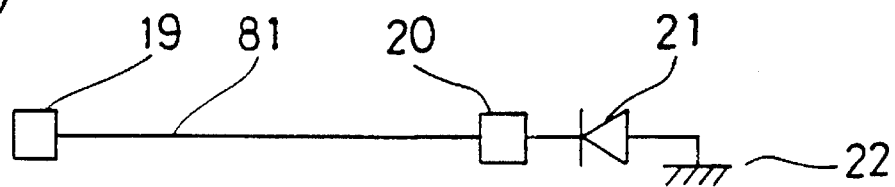
FIGS. 1(a) to 1(d) are typical diagrams showing examples of wirings and pads of a base substrate of an MCM in accordance with a first to a fourth embodiments of the present invention.

In FIG. 1(a) showing a first embodiment of the present invention, reference numeral 19 designates an A-type bonding pad for connection between the base substrate and a package, which is formed in the peripheral part of the base substrate. Numeral 20 designates a B-type bonding pad for connection between the base substrate and the IC chip, which is formed inside the base substrate. Numeral 81 designates a wiring for connection between the A-type bonding pad 19 and the B-type bonding pad 20. Numeral 21 designates a diode incorporated in the base substrate produced in the vicinity of the B-type pad 20. An end (cathode) of the diode 21 is connected with the B-type pad 20 and the other end (anode) of the diode 21 is connected to the ground 22.

Figure 1B:
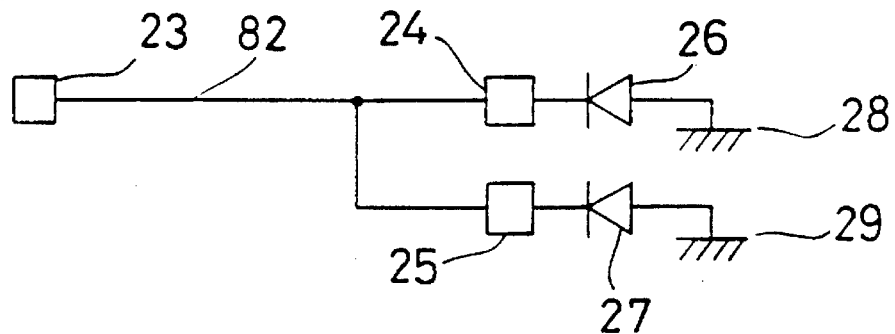

In FIG. 1(b) showing a second embodiment of the present invention, in which a plurality of B-type pads 24 and 25 are connected with a single A-type pad 23 by a wiring 82, an end (cathode) of a diode 26 is connected with the B-type pad 24 and an end (cathode) of a diode 27 is connected with the B-type pad 25. The other end (anode) of the diode 26 is connected to the ground 28 and the other end (anode) of the diode 27 is connected to the ground 29.

Figure 1C:
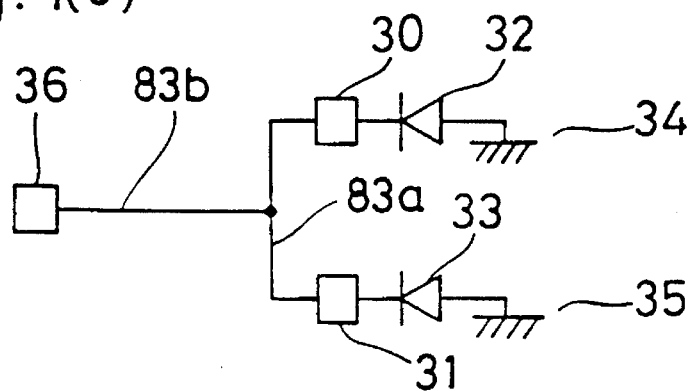

FIG. 1(c) shows a third embodiment of the present invention, in which diodes are provided for a wiring for connection between B-type pads. In the figure, an end (cathode) of a diode 32 is connected with a B-type pad 30 and an end (cathode) of a diode 33 is connected with a B-type pad 31. The other end (anode) of the diode 32 is connected to the ground 34 and the other end (anode) of the diode 33 is connected to the ground 35, an A-type pad 36 is provided for inspection, the B-type pads 30 and 31 are connected by a wiring 83a, and further, the wiring 83a and the A-type pad 36 are connected by a wiring 83b.

Figure 1D:
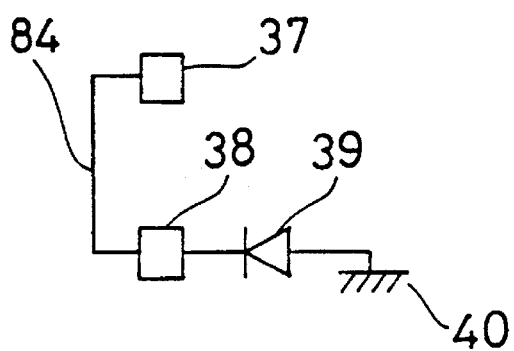
Figure 11:
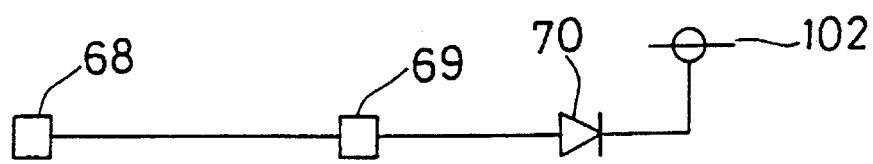
FIG. 11 is a typical diagram showing an example of wirings and pads formed on a base substrate of an MCM in accordance with a thirteenth embodiment of the present invention.
Figure 28:
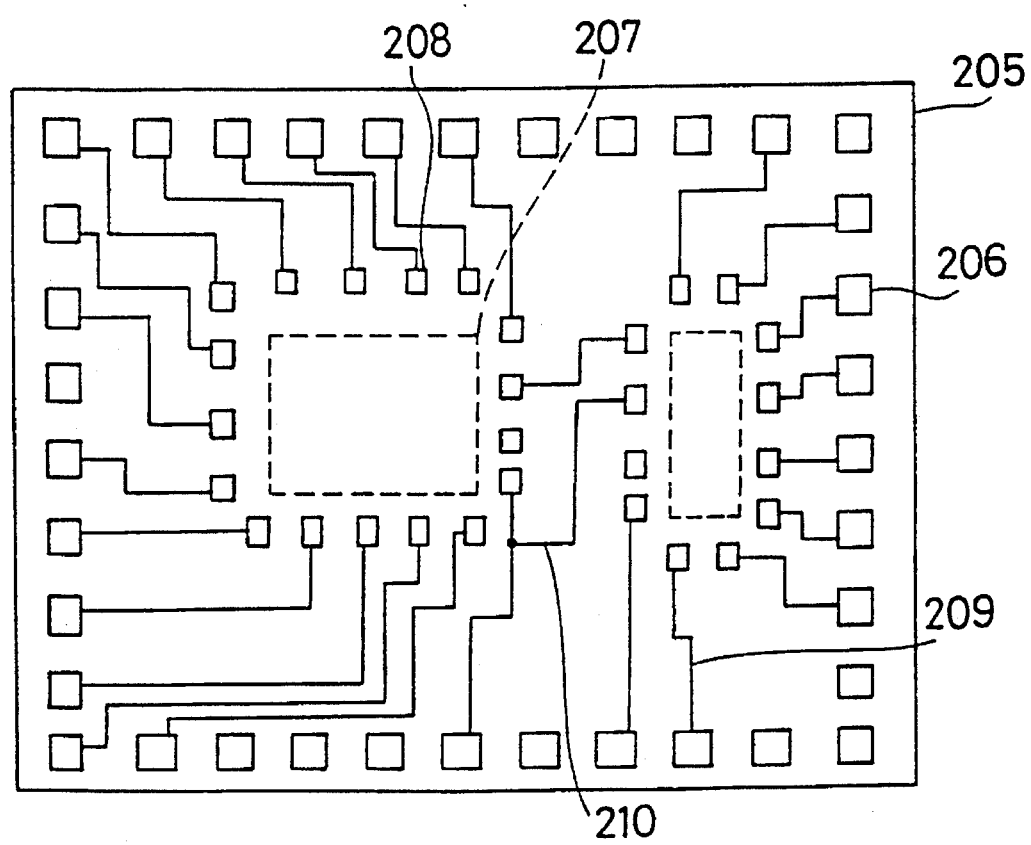
FIG. 28 is a plan view showing an example of patterns of general wirings and pads of a base substrate of an MCM.
Figure 29:
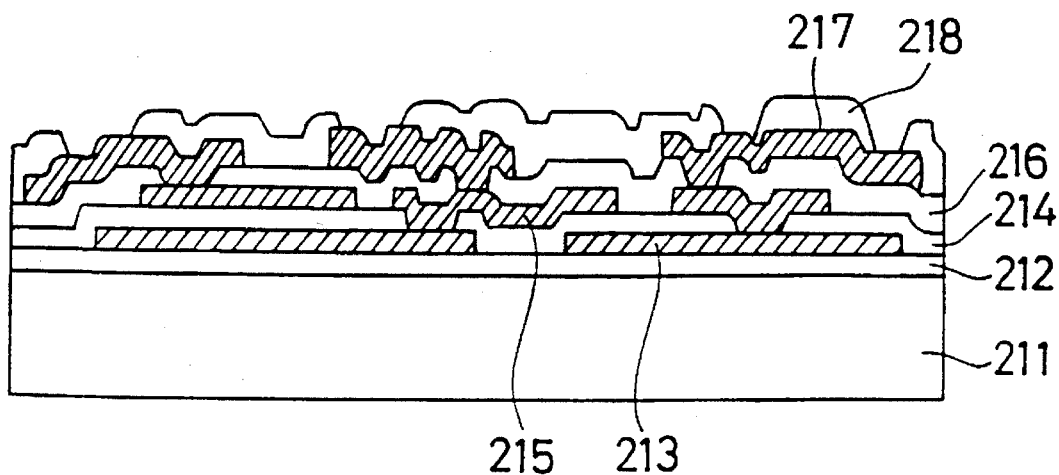
FIG. 29 is a cross-sectional view showing a general wiring structure of a base substrate of an MCM.
Figure 30:
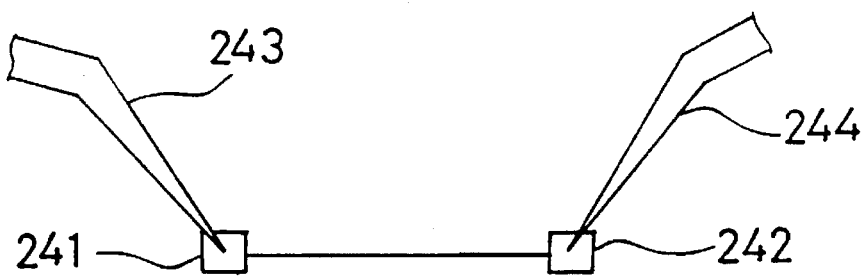
FIG. 30 is a typical view showing a prior art inspecting method of a base substrate of an MCM.

FIG. 1(d) shows a fourth embodiment of the present invention, in which another arrangement of diodes is provided for connection for a wiring between B-type pads. In the figure, B-type pads 37 and 38 are connected by a wiring 84 and either of a B-type pad 37 or 38 is employed as an inspecting pad and a diode 39 is provided one end (cathode) of which is connected with an end of the other of them, and further the other end of which is connected to the ground 40. A wiring pattern of the base substrate of MCM in accordance with these embodiments is the same as that shown in FIG. 28. The embodiments of wiring in the present invention are as shown in FIGS. 1(a) to 1(d). As shown in FIG. 11 showing a thirteenth embodiment of the present invention, the same effects can be obtained by connecting a a diode 70 to a power supply 102, in stead of grounding it.

A description is given of an example of a method for forming a diode incorporating in the substrate in accordance with an eleventh, a twelfth and a fourteenth embodiments of the present invention.

(Example 1)

Figure 8:
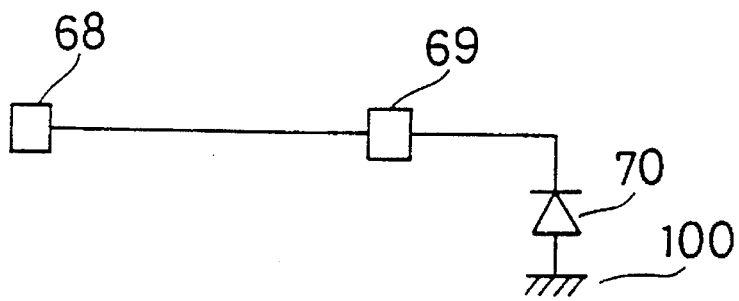
FIG. 8 is a typical diagram showing an example of wirings and pads formed on a base substrate of an MCM in accordance with the present invention.
Figure 9:
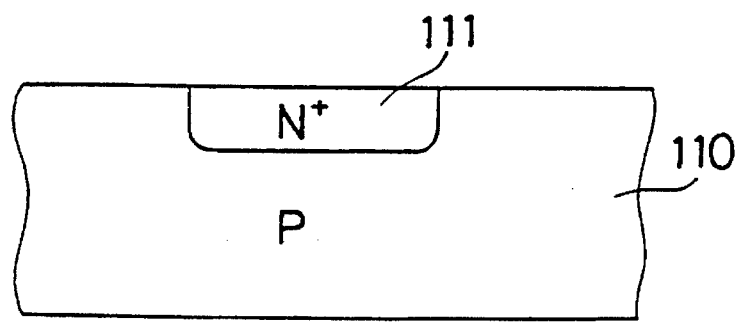
FIG. 9 is a sectional view showing a structure of a diode formed in a base substrate of an MCM in accordance with an eleventh embodiment of the present invention.

FIG. 9 is a cross-sectional view showing a case of an eleventh embodiment in which a p-type Si wafer is employed as the base substrate and a circuit shown in FIG. 8 corresponding to a circuit of FIG. 1(*a*) is added. In FIG. 8 corresponding to FIG. 1, numeral 68 designates an A-type pad and numeral 69 designates a B-type pad. Numeral 70 designates a diode whose an end (cathode) is connected with the B-type pad 69 and the other end (anode) is connected to the ground 100. A process flow for producing the device of FIG. 9 is as described below.

First, an oxide film is formed on a p-type Si wafer 110 and a photoresist is applied thereon. Then, the photoresist is partially exposed to light and developed, to produce an aperture at a part corresponding to an $N^+$ region. A part of the oxide film exposed from the aperture of the photoresist is etched to be removed. Then, n-type ions such as P or As are injected into the base substrate 110 through the aperture of the photoresist, and then the photoresist is peeled off and diffusion of n-type ions by annealing is carried out to produce an n-type region 111. Thereafter, the process flow for the base substrate the same as the above-described usual process flow is conducted. Here, the rear surface of the substrate 110 serves as the ground 100 of FIG. 8.

(Example 2)

Figure 10:
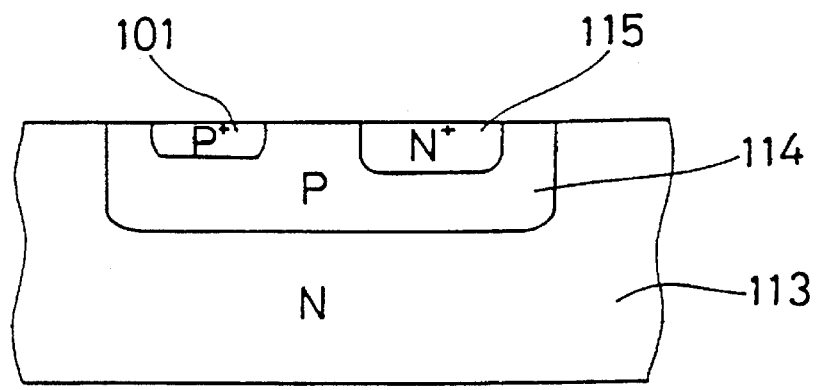
FIG. 10 is a sectional view showing a structure of a diode formed in a base substrate of an MCM in accordance with a twelfth embodiment of the present invention.

FIG. 10 is a cross-sectional view showing a case of a twelfth embodiment in which an n-type Si wafer is employed as the base substrate and a circuit shown in FIG. 8 is added. A process flow of FIG. 8 is as described below.

First, an oxide film is formed on an n-type Si wafer 113 and a photoresist is applied thereon. Then, the photoresist is partially exposed to light and developed, to produce an aperture at a part corresponding to a p-type region. A part of the oxide film exposed from the aperture of the photoresist is etched to be removed. Then, p-type impurities such as boron are injected into the base substrate 113 through the aperture of the photoresist, and then the photoresist is peeled off. Diffusion of p-type impurities is carried out to produce a p-type region 114 and an oxide film is formed on the entire surface of the substrate. Next, a photoresist is applied on the entire surface of the substrate, and then the photoresist is partially exposed to light and developed, to produce an aperture at a part corresponding to an $N^+$ region. A part of the oxide film exposed from the aperture of the photoresist is etched to be removed. Then, n-type ions such as P or As are injected into the p-type region 114 to form an $N^+$ region. Then, a similar process is carried out to produce a $P^+$ region by employing injection of p-type impurities in place of n-type impurities. After thus producing an $N^+$ region and a $P^+$ region in the p-type region 114, diffusion is carried out to produce an $N^+$ region 115 and a $P^+$ region 101 at the same time. Thereafter, an oxide film is formed on the entire surface and a photoresist is applied thereon. This photoresist is partially exposed to light and developed, to thereafter etch the oxide films on the $N^+$ region and the $P^+$ region and thereafter the photoresist is peeled off. Thereafter, the process flow for the base substrate the same as the above-described usual process flow is conducted. Here, the ground 100 of FIG. 8 corresponds to the $P^+$ region 101 of FIG. 10.

(Example 3)

Figure 12:
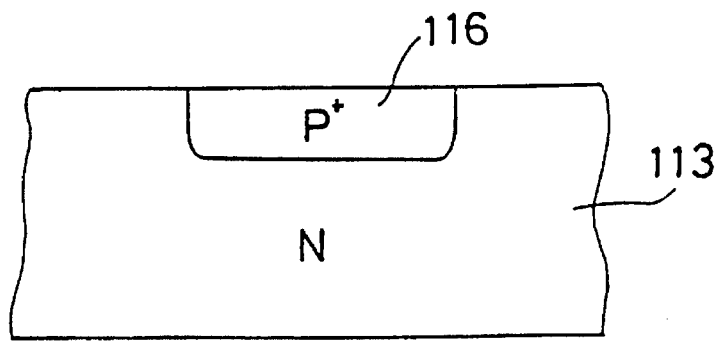
FIG. 12 is a sectional view showing a structure of a diode formed in a base substrate of an MCM in accordance with a fourteenth embodiment of the present invention.
Figure 13A:
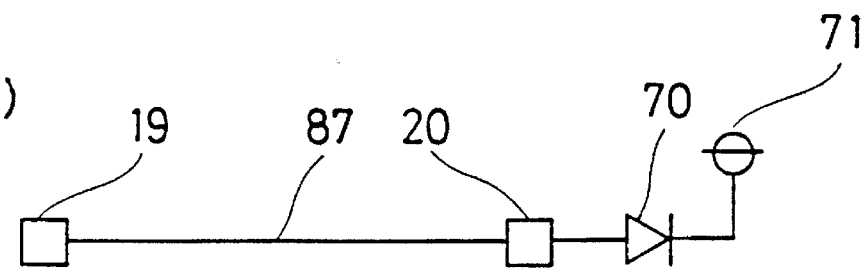
FIGS. 13(a) to 13(d) are typical diagrams showing examples of wirings and pads formed on a base substrate of an MCM in accordance with a fifteenth to an eighteenth embodiments of the present invention.
Figure 13B:
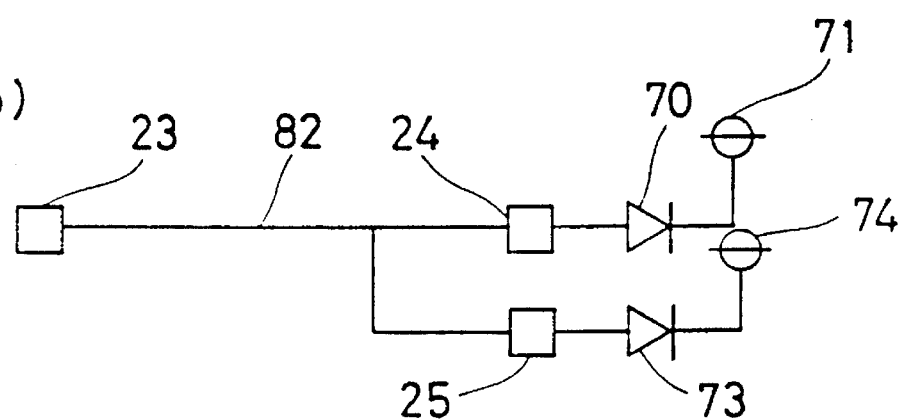
Figure 13C:
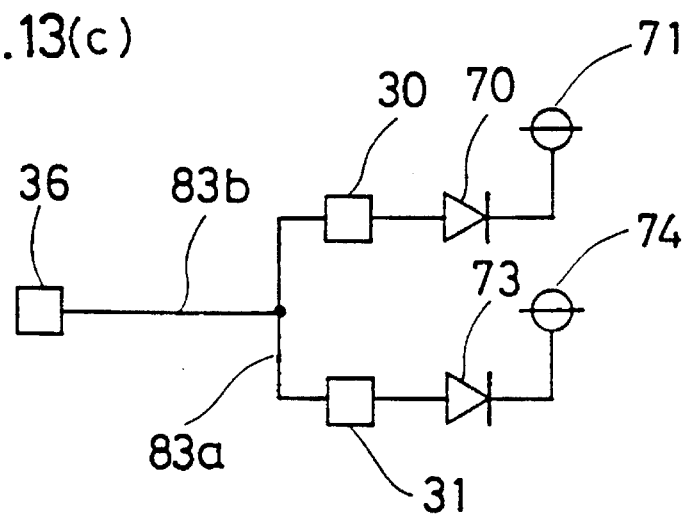
Figure 13D:
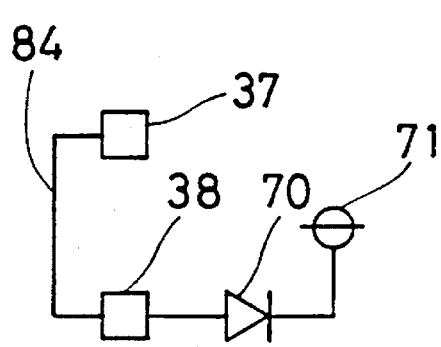

FIG. 12 is a cross-sectional view showing a diode of a fourteenth embodiment in which an n-type Si wafer is employed as the base substrate, which is illustrated in FIG. 11 showing an MCM of a thirteenth embodiment. A process flow of FIG. 12 is as described below.

First, an oxide film is formed on an n-type Si wafer 113 and a photoresist is applied thereon. Then, the photoresist is partially exposed to light and developed, to produce an aperture at a part corresponding to a $P^+$ region. A part of the oxide film exposed from the aperture of the photoresist is etched to be removed. Then, p-type ions such as boron are injected into the n-type substrate 113 through the aperture of the photoresist to form a $P^+$ region, and then the photoresist is peeled off. Diffusion of p-type ions by annealing is carried out to produce a $P^+$ region 116. Thereafter, the process flow for the base substrate the same as the above-described usual process flow is conducted. Here, the rear surface of the substrate 113 serves as the power supply 102 of FIG. 11.

Figure 2:
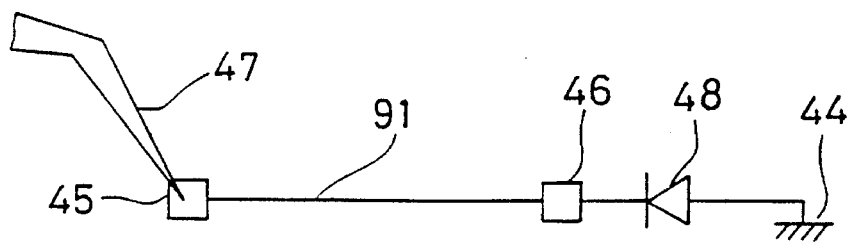
FIG. 2 is a typical diagram showing an example of wirings and pads formed on a base substrate of an MCM to be inspected by an inspecting method in accordance with a fifth embodiment of the present invention.
Figure 3:
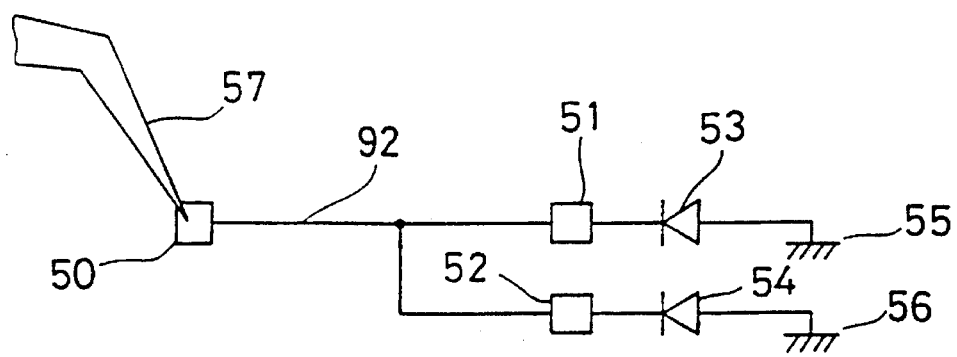
FIG. 3 is a typical diagram showing an example of wirings and pads formed on a base substrate of an MCM to be inspected by an inspecting method in accordance with a sixth embodiment of the present invention.
Figure 4:
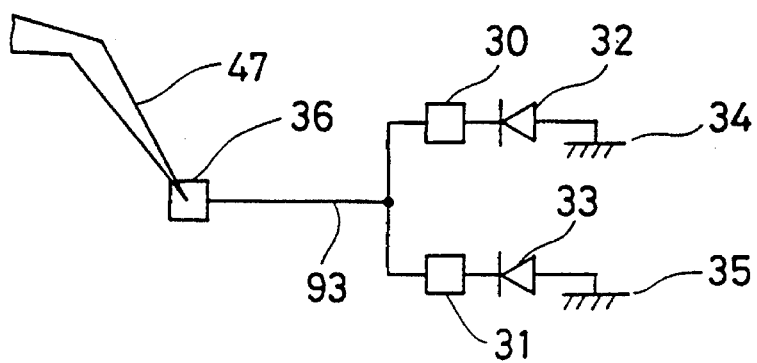
FIG. 4 is a typical diagram showing an example of wirings and pads formed on a base substrate of an MCM to be inspected by an inspecting method in accordance with a seventh embodiment of the present invention.
Figure 5:
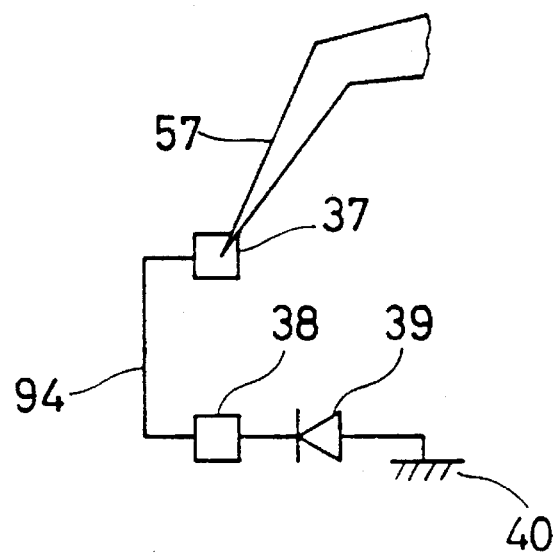
FIG. 5 is a typical diagram showing an example of wirings and pads formed on a base substrate of an MCM to be inspected by an inspecting method in accordance with an eighth embodiment of the present invention.
Figure 6:
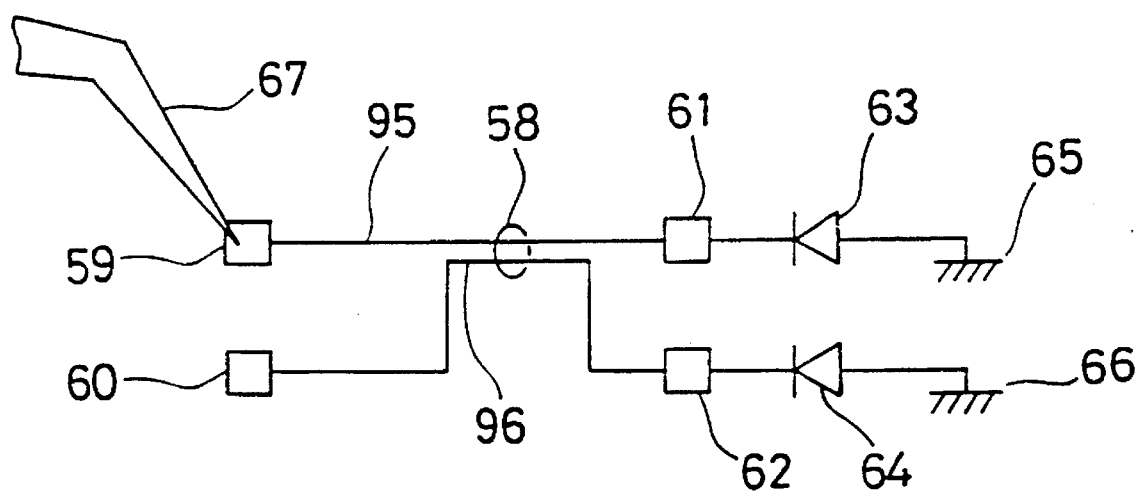
FIG. 6 is a typical diagram showing an example of wirings and pads formed on a base substrate of an MCM to be inspected by an inspecting method in accordance with a ninth embodiment of the present invention.

A description is given of a method for inspecting the base substrate of MCM formed as described above according to a fifth to a ninth embodiments of the present invention. In FIG. 2 corresponding to the base substrate of the first embodiment of FIG. 1(*a*) and showing an inspecting method in accordance with the fifth embodiment, with applying positive voltage to the ground 44 and applying a zero voltage to a probe 47 in contact with an A-type pad 45, a current flowing through the probe 47 is measured. When there is an open-circuit default, the default is detected from that a current does not flow. This inspecting method can be employed similarly in the base substrate of FIG. 1(*d*) in which wirings are formed between only B-type pads. More particularly, in FIG. 5 corresponding to the base substrate of the fourth embodiment of FIG. 1(*d*) and showing an inspecting method in accordance with an eighth embodiment, with applying positive voltage to the ground 40 and applying a zero voltage to a probe 57 in contact with a B-type pad 37, a current flowing through the probe 57 is measured. When there is an open-circuit default in a wiring 94 connecting B-type pads 37 and 38, the default is detected from that a current does not flow. In FIG. 3 corresponding to the base substrate of the second embodiment of FIG. 1(*b*) and showing an inspecting method in accordance with the sixth embodiment, with applying a positive voltage to the grounds 55 and 56 and applying a zero voltage to a probe 57 in contact with an A-type pad 50, a current flowing through the probe 57 is measured. In this case, because two diodes are employed in parallel with each other, taking ON resistances of the diodes into consideration, a current value increases in comparison with a case where an A-type pad and a B-type pad are employed as shown in FIG. 2 and it can be detected at the A-type pad that the B-type pad is employed in plural. This inspecting method can be employed similarly in the base substrate FIG. 1(*c*) in which wirings are formed between only B-type pads. More particularly, in FIG. 4 corresponding to the base substrate of the third embodiment of FIG. 1(*c*) and showing an inspecting method in accordance with the seventh embodiment, with applying a positive voltage to the grounds 34 and 35 and applying a zero voltage to a probe 47 in contact with an A-type pad 36, a current flowing through the probe 47 is measured. In this case, because two diodes are employed in parallel with each other, taking ON resistances of the diodes into consideration, a current value increases in comparison with a case where an A-type pad and a B-type pad are employed as shown in FIG. 2 and it can be detected at the A-type pad that the B-type pad is employed in plural. When a short-circuiting default 58 occurs between wirings 95 and 96, namely, at a point connecting an A-type pad 59 and a B-type pad 61 as shown in FIG. 6, showing an inspecting method in accordance with a ninth embodiment, by that a positive voltage applied to both of the grounds 65 and 66 and that a current flows into a probe 67 through both the diodes 63 and 64, a larger current flows than in a case where no short-circuiting default occurs, thereby enabling to detect a short-circuiting default. In addition, when an MCM is produced as a product by employing a base substrate mounting such a turned-on electricity inspecting diode, an A-type pad is connected with a package and a B-type pad is connected with an IC chip and usually voltages for driving the IC, namely, 0 V and 5 V in a logic IC, are applied to the A-type pad and the B-type pad, respectively, or reversely thereto, and in these ranges of voltages, the B-type pad is electrically separated from the grounding part due to a function of the diode and the function of inspecting the substrate in the respective above described embodiments give no unfavorable influences on the operation of the MCM.

Thus, in the above described embodiments, by providing the inspecting diode in the vicinity of a bonding pad formed on the base substrate and connects the base substrate and the IC chip and connecting an end of the diode with the bonding pad and the other end of the diode with the ground or a power supply voltage on the base substrate, it is only required to contact probes of a probe card with the bonding pad which is disposed at the periphery for connection between the base substrate and the package, to carry out inspection of the base substrate. Therefore, it is not required to provide probes which are to be contacted with the bonding pads for connection between the base substrate and the IC chip, resulting in reduction in cost for constituting the probe card. Still, because the number of the probes is reduced, it is possible to reduce the possibility of occurring contact defaults between the probe card and the bonding pad to a large extent. Further, in the respective embodiments, since the turned-on electricity inspecting diode is formed in a process of producing the base substrate, it is possible to reduce an increase in cost for producing the substrate to a great large extent with providing the inspecting function.

Figure 7:
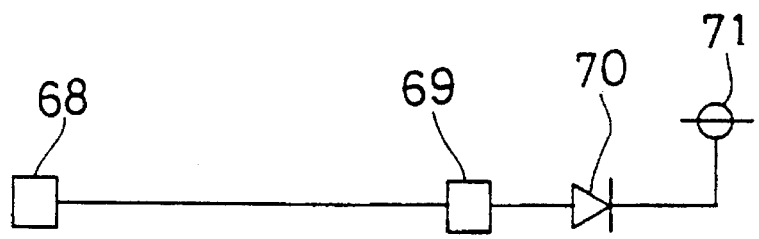
FIG. 7 is a typical diagram showing an example of wirings and pads formed on a base substrate of an MCM in accordance with a tenth embodiment of the present invention.

In addition, as in the embodiment shown in FIG. 1(*d*), when a turned-on electricity inspection is carried out for wirings formed on the base substrate connecting between bonding pads for connection between the base substrate and the IC chip, without conducting excessive wiring, it is only required to provide probes which are contacted with the bonding pad for connection between the base substrate and the IC, on the probe card with no probes being required which are contacted with the bonding pads for connection between the base substrate and the package, resulting in the same effects as in FIGS. 1(*a*) to 1(*c*). Also, in FIGS. 1(*b*) to 1(*d*), similarly in FIG. 7 showing a tenth embodiment of the present invention, the other end of the diode can be connected with a predetermined voltage, for example, a power supply voltage, with the same effects as the above described embodiments. However, this voltage is required to be in a range of the usual operation voltage of the general logic IC, as described above.

FIGS. 13(*a*) to 13(*d*) schematically show arrangement of pads and wirings on the base substrate of MCM in accordance with a fifteenth to an eighteenth embodiments of the present invention, respectively.

In FIG. 13(*a*) showing a fifteenth embodiment of the present invention, reference numeral 19 designates an A-type bonding pad for connection between the base substrate and a package, which is formed in the peripheral part of the base substrate. Numeral 20 designates a B-type bonding pad for connection between the base substrate and the IC chip, which is formed inside the base substrate. Numeral 81 designates a wiring for connection between the A-type bonding pad 19 and the B-type bonding pad 20. Numeral 70 designates a diode incorporated in the base substrate produced in the vicinity of the B-type pad 20. An end (anode) of the diode 70 is connected with the B-type pad 20 and the other end (cathode) of the diode 70 is connected to a power supply 71.

In FIG. 13(*b*) showing a sixteenth embodiment of the present invention, in which a plurality of B-type pads 24 and 25 are connected with a single A-type pad 23 by a wiring 82, an end (anode) of a diode 70 is connected with the B-type pad 24 and an end (anode) of a diode 73 is connected with the B-type pad 25. The other end (cathode) of the diode 70 is connected to a power supply 71 and the other end (cathode) of the diode 73 is connected to a power supply 29.

FIG. 13(*c*) shows a seventh embodiment of the present invention, in which diodes are provided for a wiring for connection between B-type pads. In the figure, an end (anode) of a diode 70 is connected with a B-type pad 30 and an end (anode) of a diode 73 is connected with a B-type pad 31. The other end (cathode) of the diode 70 is connected to a power supply 71 and the other end (cathode) of the diode 73 is connected to a power supply 74, an A-type pad 36 is provided for inspection, the B-type pads 30 and 31 are connected by a wiring 83*a*, and further, the wiring 83*a* and the A-type pad 36 are connected by a wiring 83*b*.

FIG. 13(*d*) shows an eighteenth embodiment of the present invention, in which another arrangement of diodes is provided for connection for a wiring between B-type pads. In the figure, B-type pads 37 and 38 are connected by a wiring 84 and either of a B-type pad 37 or 38 is employed as an inspecting pad and a diode 70 is provided one end (anode) of which is connected with an end of the other of them, and further the other end of which is connected to a power supply 71. A wiring pattern of the base substrate of MCM in accordance with these embodiments is the same as that shown in FIG. 28.

Figure 14:
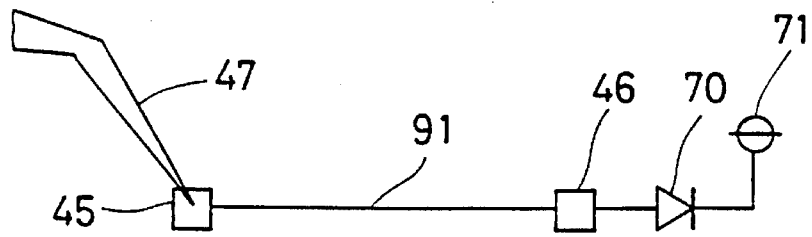
FIG. 14 is a typical diagram showing an example of wirings and pads formed on a base substrate of an MCM to be inspected by an inspecting method in accordance with a nineteenth embodiment of the present invention.
Figure 15:
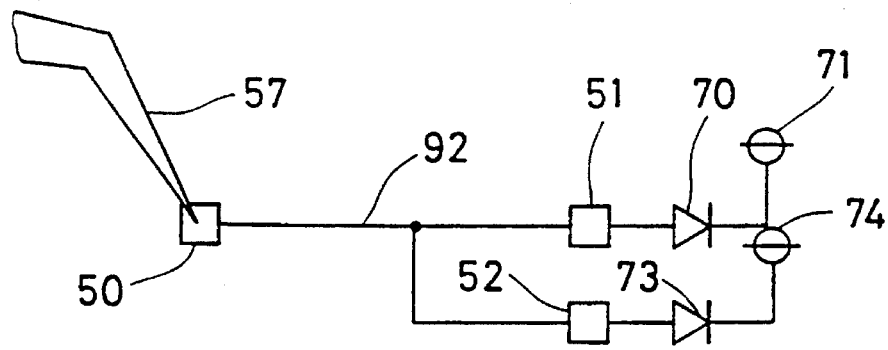
FIG. 15 is a typical diagram showing an example of wirings and pads formed on a base substrate of an MCM to be inspected by an inspecting method in accordance with a twentieth embodiment of the present invention.
Figure 16:
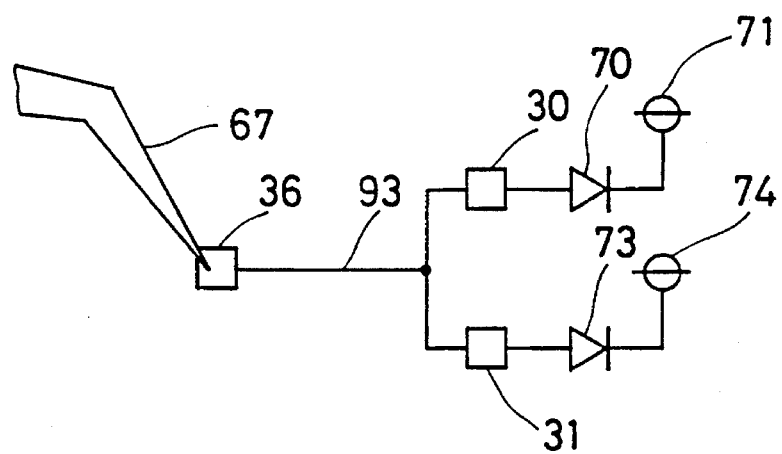
FIG. 16 is a typical diagram showing an example of wirings and pads formed on a base substrate of an MCM to be inspected by an inspecting method in accordance with a twenty first embodiment of the present invention.
Figure 17:
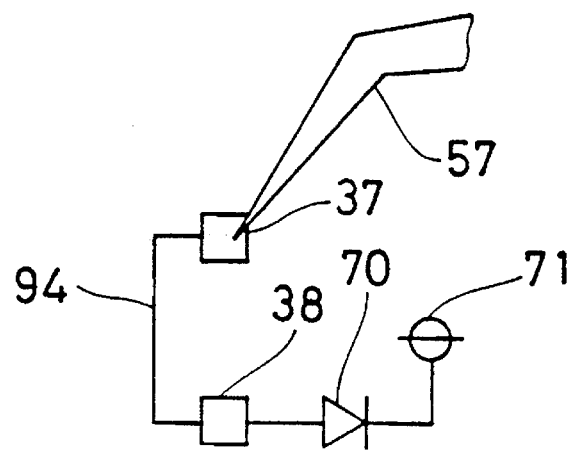
FIG. 17 is a typical diagram showing an example of wirings and pads formed on a base substrate of an MCM to be inspected by an inspecting method in accordance with a twenty second embodiment of the present invention.
Figure 18:
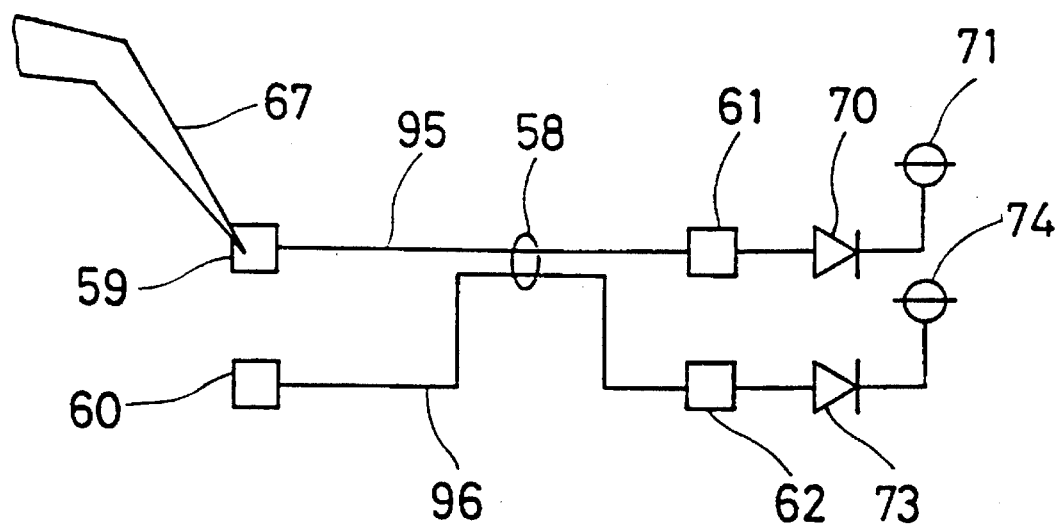
FIG. 18 is a typical diagram showing an example of wirings and pads formed on a base substrate of an MCM to be inspected by an inspecting method in accordance with a twenty third embodiment of the present invention.

A description is given of a method for inspecting the base substrate of MCM formed as described above according to a nineteenth to a twenty third embodiments of the present invention. In FIG. 14 corresponding to the base substrate of the fifteenth embodiment of FIG. 13(*a*) and showing an inspecting method in accordance with the nineteenth embodiment, with applying a zero voltage to a power supply 71 and applying a positive voltage to a probe 47 in contact with an A-type pad 45, a current flowing through the probe 47 is measured. When there is an open-circuit default, the default is detected from that a current does not flow. This inspecting method can be employed similarly in the base substrate of FIG. 13(*d*) in which wirings are formed between only B-type pads. More particularly, in FIG. 17 corresponding to the base substrate of the eighteenth embodiment of FIG. 13(*d*) and showing an inspecting method in accordance with a twenty second embodiment, with applying a zero voltage to the power supply 71 and applying a positive voltage to a probe 57 in contact with a B-type pad 37, a current flowing through the probe 57 is measured. When there is an open-circuit default in this wiring, the default is detected from that a current does not flow. In FIG. 15 corresponding to the base substrate of the sixteenth embodiment of FIG. 13(*b*) and showing an inspecting method in accordance with a twentieth embodiment, with applying a zero voltage to the power supplies 71 and 74 and applying a positive voltage to a probe 57 in contact with an A-type pad 50, a current flowing through the probe 57 is measured. In this case, because two diodes are employed in parallel with each other, taking ON resistances of the diodes into consideration, a current value increases in comparison with a case where an A-type pad and a B-type pad are employed as shown in FIG. 2 and it can be detected at the A-type pad that the B-type pad is employed in plural. This inspecting method can be employed similarly in the base substrate FIG. 13(c) in which wirings are formed between only B-type pads. More particularly, in FIG. 16 corresponding to the base substrate of the seventeenth embodiment of FIG. 13(c) and showing an inspecting method in accordance with the twenty first embodiment, with applying a zero voltage to the power supplies 71 and 74 and applying a positive voltage to a probe 67 in contact with an A-type pad 36, a current flowing through the probe 67 is measured. In this case, because two diodes are employed in parallel with each other, taking ON resistances of the diodes into consideration, a current value increases in comparison with a case where an A-type pad and a B-type pad are employed as shown in FIG. 2 and it can be detected at the A-type pad that the B-type pad is employed in plural. When a short-circuiting default 58 occurs between wirings 95 and 96, namely, at a point connecting an A-type pad 59 and a B-type pad 61 as shown in FIG. 18, showing an inspecting method in accordance with a twenty third embodiment, by that a zero voltage applied to both of the power supplies 71 and 74 and that a current flows into a probe 67 through both the diodes 70 and 73, a larger current flows than in a case where no short-circuiting default occurs, thereby enabling to detect a short-circuiting default. In addition, when an MCM is produced as a product by employing a base substrate mounting such a turned-on electricity inspecting diode, an A-type pad is connected with a package and a B-type pad is connected with an IC chip and usually voltages for driving the IC, namely, 0 V and 5 V in a logic IC, are applied to the A-type pad and the B-type pad, respectively, or reversely thereto, and in these ranges of voltages, the B-type pad is electrically separated from the grounding part due to a function of the diode and the function of inspecting the substrate in the respective above described embodiments give no unfavorable influences on the operation of the MCM.

While in the respective embodiments a turned-on electricity inspecting diode is produced in the base substrate, the turned-on electricity inspecting diode can be mounted as a discrete part on the base substrate. In this case, however, it is necessary to conduct testing of a pad for mounting the diode or the wiring therefor, separately. Further, while in the respective embodiments only IC chips are mounted on the base substrate, other electronic parts can be mounted, with the same effects as the above-described respective embodiments.

A description is given of a twenty fourth embodiment in which an electric inspection of the base substrate is eased by employing a short-circuiting wiring.

Figure 19:
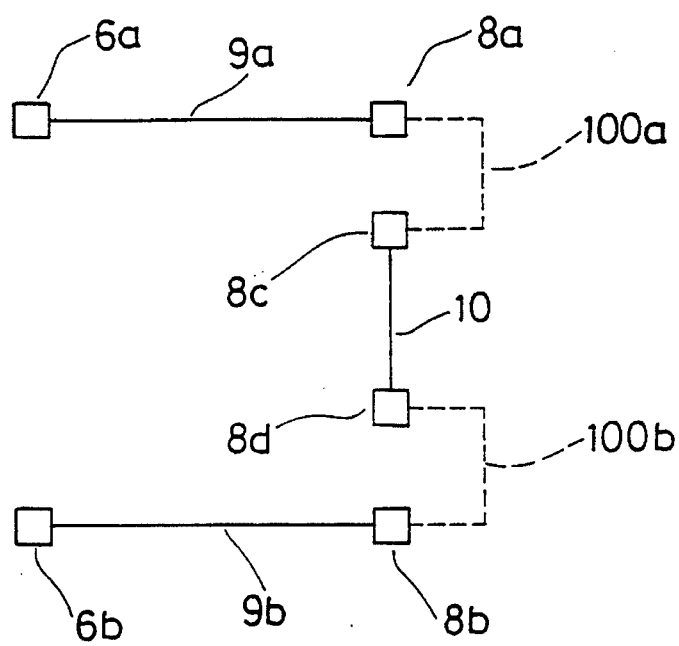
FIG. 19 is a schematic view showing a wiring pattern and a short-circuiting wiring of a base substrate of an MCM in accordance with a twenty fourth embodiment of the present invention.
Figure 20:
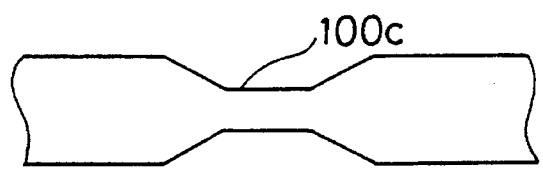
FIG. 20 is a schematic view showing a fuse pattern formed in the short-circuiting wiring of FIG. 19 in accordance with a twenty fifth embodiment of the present invention.
Figure 21A:
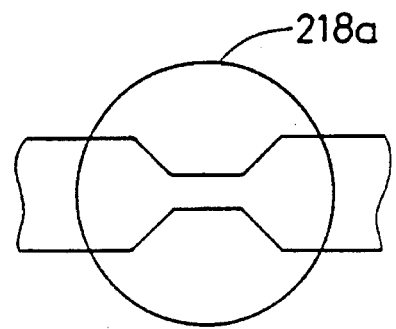
FIGS. 21(a) and 21(b) are schematic views showing an aperture formed in a protection layer for protecting a wiring layer where the fuse pattern of FIG. 19 is formed in accordance with a twenty sixth and a twenty seventh embodiments of the present invention.
Figure 21B:
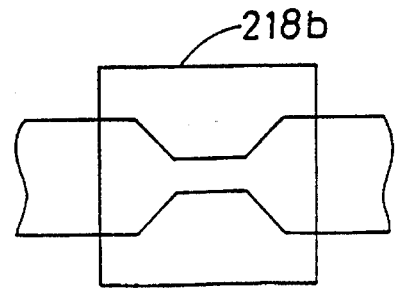
Figure 22:
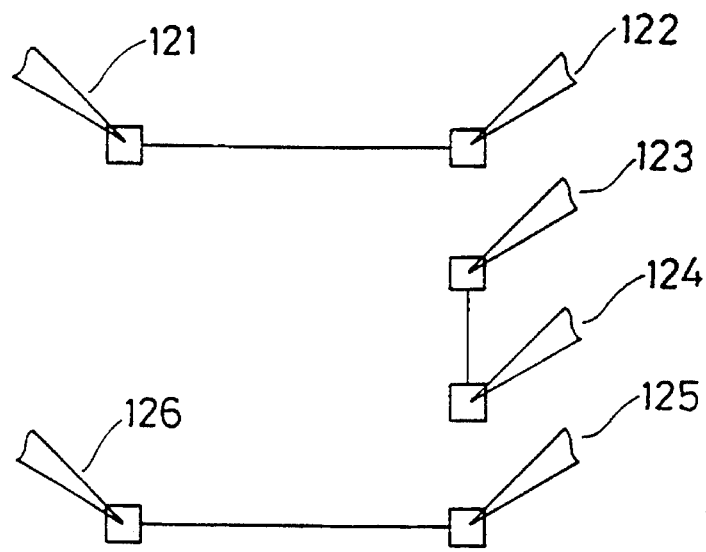
FIG. 22 is a schematic view showing positions which are originally to be probed in the wiring pattern of FIG. 19.
Figure 23:
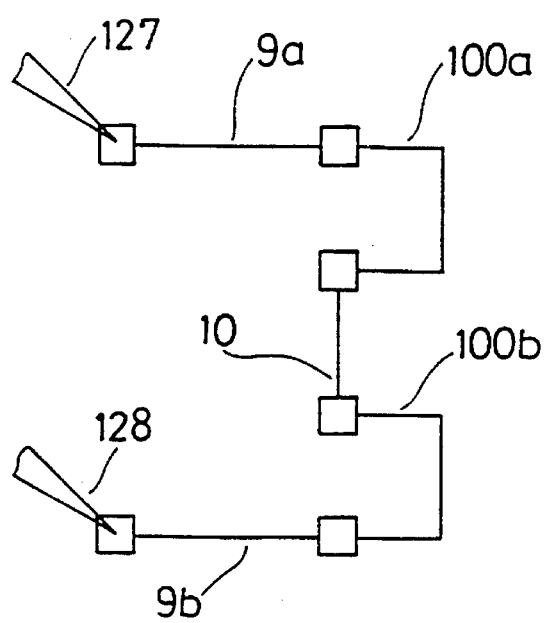
FIG. 23 is a schematic view showing positions which are probed in the embodiment of FIG. 19, in accordance with a twenty eighth embodiment of the present invention.

FIG. 19 shows the base substrate of MCM in accordance with the twenty fourth embodiment of the present invention, and especially wiring patterns on the substrate and a short-circuiting wirings added in this embodiment. FIG. 20 shows a fuse pattern 100c arranged in the short-circuiting wiring of FIG. 19, which is a twenty fifth embodiment. FIGS. 21(a) and 21(b) show apertures 218a and 218b formed in a protection layer for protecting a wiring layer where the fuse pattern is formed, which is respectively a twenty sixth and a twenty seventh embodiment. FIG. 22 shows some points which should be probed essentially in the wiring pattern of FIG. 19. FIG. 23 shows some points which are probed on the base substrate in a twenty eighth embodiment. In FIGS. 19 to 23, A-type pads 6a and 6b are provided at the peripheral part of the base substrate for the connection between the base substrate and the package. B-type pads 8a, 8b, 8c and 8d are provided in the region where a semiconductor chip is mounted on the base substrate for the connection between the base substrate and the IC chip. Wiring patterns 9a and 9b electrically connect the A-type pads 6a and 6b with the B-type pads 8a and 8b. A wiring pattern 10 electrically connects the B-type pad 8c with the B-type pad 8d. A short-circuiting wiring 100a is provided to connect the B-type pad 8a with the B-type pad 8c and a short-circuiting wiring 100b is provided to connect the B-type pad 8d with the B-type pad 8b so as to make the wiring pattern 9a, the wiring pattern 10 and the wiring pattern 9b electrically continuous to each other and after the inspection, the short-circuiting wirings 100a and 100b are cut off, resulting in electrical separations of the wiring pattern 9a and 9b from the wiring pattern 10, respectively.

As shown in FIG. 19, there are wiring patterns each between an A-type pad and a B-type pad and wiring patterns each between B-type pads, as patterns of the base substrate of MCM in this embodiment. Short-circuiting wirings are arranged between these wiring patterns so as to short-circuit therebetween. A fuse pattern to be provided in this short-circuiting wiring may be provided at any position of the short-circuiting wiring. As this fuse pattern, a narrow pattern width portion is provided in the wiring pattern as to be cut off easily by such as a laser as shown in FIG. 20. It is effective to put the respective fuse patterns in the vicinity to each other so as to be cut off easily after inspection. In addition, it is required to provide an aperture in a passivation film covering this fuse pattern for cutting of the fuse pattern. The aperture is arranged only at the part to be cut off as shown in FIG. 21, in view of its reliability.

When the base substrate includes plural wiring layers and plural insulating layers, the fuse is formed at an uppermost wiring layer and the fuse aperture pattern is provided in the protection layer above the wiring layer. When a fuse is formed in any wiring layer other than the uppermost wiring layer, the aperture must be provided in the insulating layer and the protection layer as upper layers than the wiring layer where the fuse is formed. It is effective to arrange the fuse circuit of this embodiment when a lot of B-type pads are employed or when chips having small pad pitch dimensions are employed. There is a case where it is effective to provide the fuse circuit of this embodiment only when the pad pitch dimension is small.

Next, a description is given of operations and effects. In this embodiment, while it is originally necessary to probe six probes 121 to 126 in a circuit of FIG. 22, when short-circuiting wirings 100a and 100b are arranged as shown in FIG. 23, only two probes 127 and 128 are required to be probed to inspect the circuit. Namely, when there is a breakage default in the pattern, the default can be detected wherever the default exists in the patterns 9a, 10 and 9b. Further, when there is a short-circuiting default in the pattern, it is possible to detect the short-circuiting default among connecting portions of the patterns 9a, 10 and 9b and a connecting portion of another patterns. In this case, the patterns 9a, 10 and 9b must be connected to each other as remotely as possible with short-circuiting wirings so that short-circuiting defaults may not occur between the pattern 9a and the pattern 10 and between the pattern 10 and the pattern 9b. As a result, after inspecting the base substrate, a desired circuit can be obtained by cutting off the fuse part provided in the short-circuiting wirings 100a and 100b.

Thus, in accordance with the above described embodiment, by regarding a plurality of wiring patterns formed on the base substrate as gatherings of links of the wiring patterns electrically connected to each other and arranging the short-circuiting wirings which restore the respective wiring patterns to essential electrically independent wiring patterns by being cut off after inspection of the base substrate, it is possible to reduce the number of pads which are probed to a large extent in this embodiment, while it is required to conduct inspection by contacting all pads on the base substrate with probes in the prior art. As a result, while in an MCM comprising about 250 A-type pads and about 420 B-type pads, it is actually impossible to produce a probe card that probes these pads at one time, it is actually possible to produce a probe card that probes these pads by reducing the number of pins which are probed, resulting in simplification of a tester and a test program. Therefore, test time by the tester is reduced to a large extent, an increase in test cost can be avoided and a complicated operation is not requested, thereby resulting in a considerably easy inspection of the base substrate. Further, it is possible to reduce the probability of faulty inspection due to a probe contact default occurring at the probing, by reducing the number of pins which are probed. In addition, it is also possible to inspect short-circuiting between the wiring patterns to be connected by short-circuiting wirings by selecting arrangement of the wiring patterns so that portions of them are not in parallel in vicinity with each other.

Thus, in the first to a twenty eighth embodiments, the diode or the short-circuiting wiring is arranged so as to ease the electrical inspection of the base substrate. In accordance with the twenty eighth embodiment, when inspecting the base substrate electrically, it is possible to produce the probe card actually, to reduce the probability of faulty contact between the probe card and the bonding pad as small as possible, to reduce the probability that non-faulty are misjudged as faulty to a large extent and to obtain the base substrate of MCM which can be inspected with the low cost probe card. Further, it is also possible to inspect short-circuiting between the wiring patterns by selecting arrangement of the wiring patterns so that portions of them are not in parallel in the vicinity with each other.

However, there is a problem in the twenty eighth embodiment as follows. Namely, while it is not necessary to probe all the pads at the inspection employing the base substrate including the short-circuiting wirings so as to ease the inspection, it is necessary to cut off all the fuse parts by a laser or the like after the inspection. This requires a specialized laser cutter and further all the fuse parts are required to be cut off, taking a lot of time for cutting off them all and resulting in high cost. In addition, whether the fuse parts are cut off or not is checked by a visual observation, resulting in low reliability in the checking process.

Figure 24:
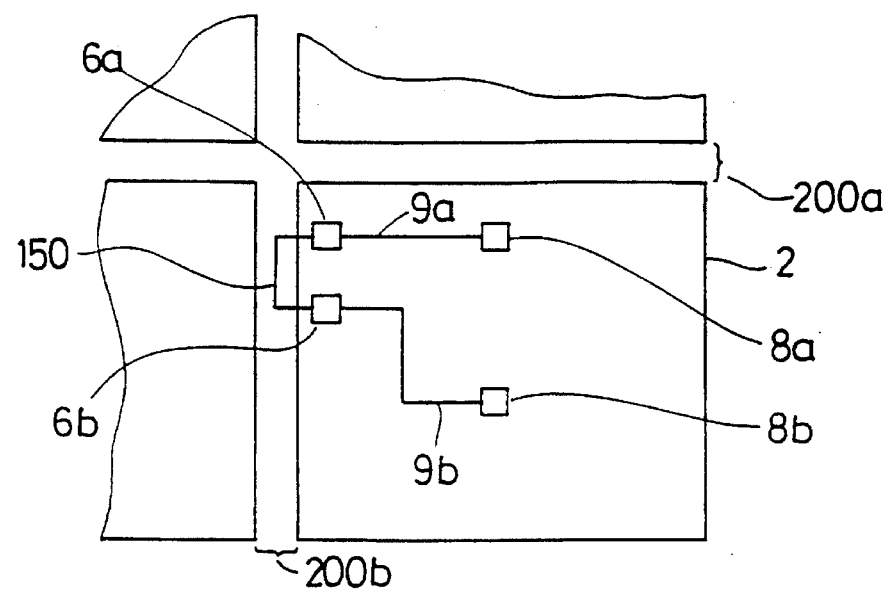
FIG. 24 is a schematic view showing a wiring pattern and a short-circuiting wiring of a base substrate of an MCM in accordance with a twenty ninth embodiment of the present invention.

A description is given of a twenty ninth to a thirty first embodiments in which the cutting off process is not required after the inspection of the base substrate including the short-circuiting wirings to ease the inspection. FIG. 24 shows the base substrate of MCM, particularly wiring patterns and a short-circuiting wiring in accordance with the twenty ninth embodiment of the present invention. In the figure, numeral 2 designates a base substrate which is a wiring board mounting IC chips or the like. Numerals 6a and 6b designate A-type bonding pads for connection between the base substrate and the package. Numerals 8a and 8b designate B-type bonding pads for connection between the base substrate and the IC chip. Numerals 9a and 9b designate wirings which are formed on the base substrate 2 and electrically connect an A-type pad with a B-type pad, respectively. Numerals 200a and 200b designate dicing lines (dicing regions) along which the base substrate 2 is cut separately from each other. Numeral 150 designates a short-circuiting wiring so as to inspect the base substrate 2. A part of the short-circuiting wiring is extending out from the base substrate 2 to cross over the dicing line 200b.

Figure 25:
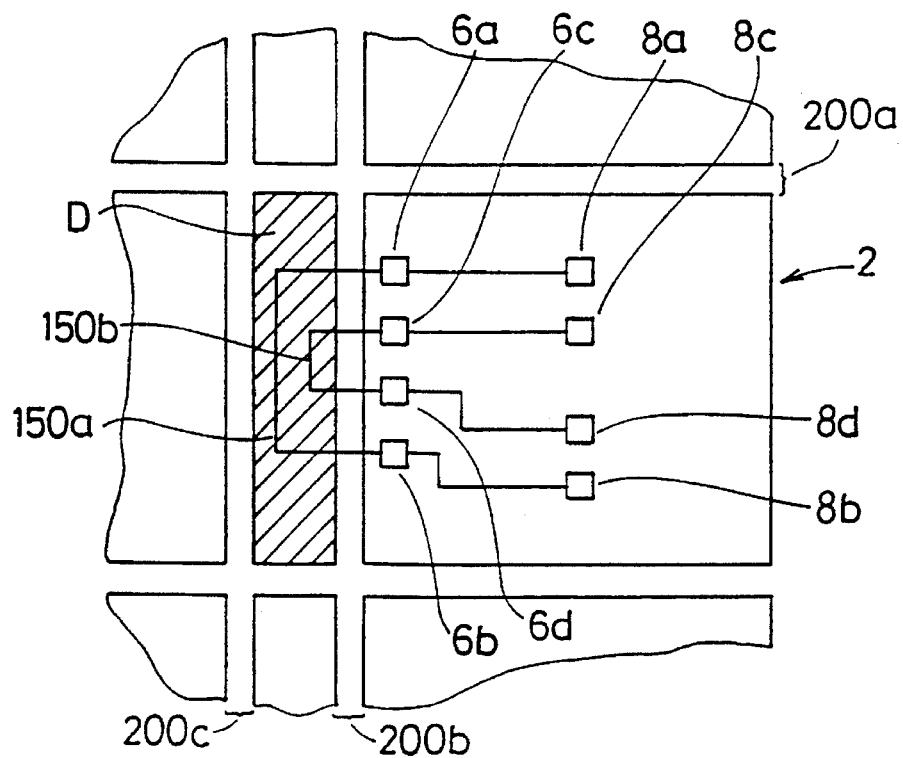
FIG. 25 is a schematic view showing a wiring pattern and a short-circuiting wiring of a base substrate of an MCM in accordance with a thirtieth embodiment of the present invention.
Figure 26:
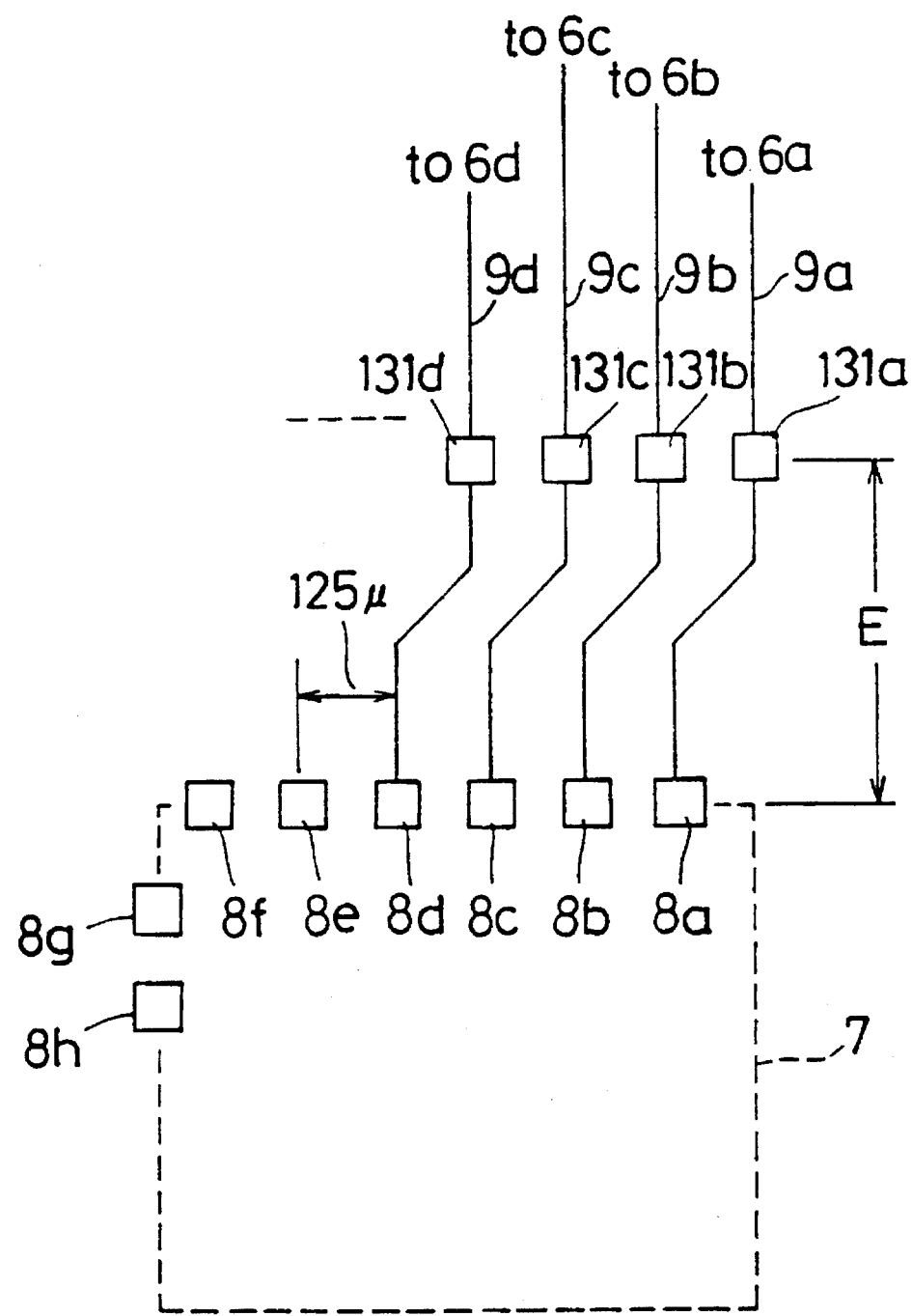
FIG. 26 is a schematic view showing a wiring pattern and a short-circuiting wiring of a base substrate of an MCM in accordance with a thirty first embodiment of the present invention.
Figure 27:
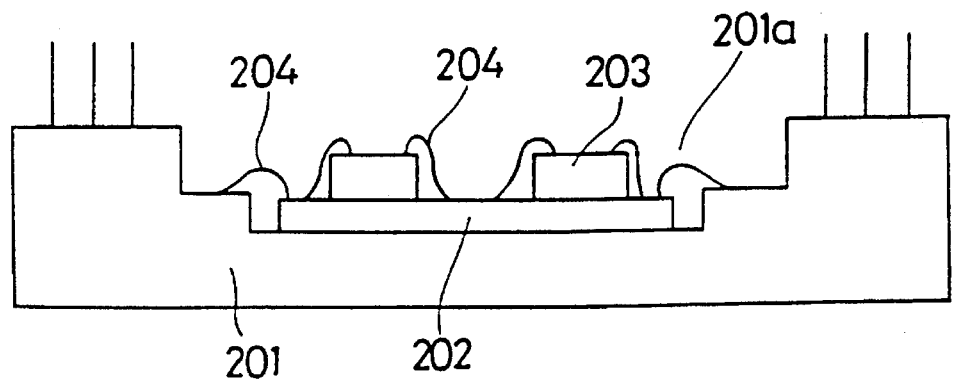
FIG. 27 is a cross-sectional view showing a general structure of an MCM.

A description is given of the operations and the effects. In this embodiment, there are provided two wirings connecting between the pads 6a and 8a and between the pads 6b and 8b, respectively and the short-circuiting wiring 150 is provided for connection between the pads 6a and 6b so as to ease the inspection. This short-circuiting wiring 150 is arranged so that a part of the wiring is disposed on the dicing line 200b. As a result, it is possible to inspect the wirings 9a and 9b at the same time by probing only the two pads 8a and 8b. Further, since the short-circuiting wiring 150 is disposed on the dicing line 200b, the wiring is automatically removed in the dicing process of the base substrate after the inspection and a special cutting off process of the short-circuiting wiring is not required. When the short-circuiting wiring cannot be laid out only on the dicing line part with an increase in the number of the wirings, as shown in a thirtieth embodiment of the present invention which is shown in FIG. 25, a dedicated region (dicing region) D in which the short-circuiting wirings are arranged can be provided outside the original dicing line 200b. Namely, in this embodiment, there are provided four wirings between the pads 6a and 8a, between the pads 6b and 8b, between pads 6c and 8c and between pads 6d and 8d and a short-circuiting wiring 150a for connection between the pads 6a and 6b and a short-circuiting wiring 150b for connection between the pads 6c and 6d in the region D surrounded by the dicing lines 200a, 200b and 200c, so as to ease the inspection. As a result, it is possible to inspect the base substrate by probing the four pads 8a, 8b, 8c and 8d at only one time. Further, since the hatched part D of FIG. 25 is automatically removed in the dicing process of the base substrate after the inspection, a finished product of the base substrate can be obtained without employing a special cutting off process for the short-circuiting wiring. In the above embodiment, the pads which are to be probed are actually B-type pads, and there may be a case where the pitch therebetween is as narrow as 125 microns and it is difficult to produce the probe card. Then, as in a thirty first embodiment of the present invention shown in FIG. 26, it may be that C-type pads 131a, 131b, 131c, 131d and so on for only inspection are provided in the way of wirings 9a, 9b, 9c, 9d and so on and that the C-type pads are probed. However, since a breakage of a wire between the C-type pad and the B-type pad cannot be detected, the distance E between the C-type pad and the B-type pad is desired to be as short as possible.

As described above, in a base substrate of MCM in accordance with the present invention, a diode is provided connected between an IC bonding pad formed on the base substrate and a node to be a predetermined voltage, namely, a ground node or a power supply voltage node, or further a terminal connecting a base substrate to a package is provided and this terminal is connected to a chip connection terminal by wirings. Or the chip connection terminals are mutually connected by wirings, or these mutually connected chip connection terminals are further connected to a base connection terminal by wirings. Therefor, the predetermined voltage is applied to the IC bonding pad from the diode, when a wiring between an A-type pad and the IC bonding pad is inspected. Thus, it is not necessary to make a probe of a probe card contact with the IC bonding pad and probes of the probe card which are to be made contacted with pads at the periphery of the base substrate or an inspecting pad are required.

In the base substrate of MCM in accordance with the present invention, the above-described diode is produced in the base substrate, thereby enabling to suppress an increase in cost for producing the base substrate due to providing the inspecting functions.

In an inspecting method for the base substrate of MCM in accordance with the present invention, since a diode is provided connected between an IC bonding pad formed on the base substrate and a node to be a predetermined voltage, namely, a ground node or a power supply voltage node, or further a terminal connecting a base substrate to a package is provided and this terminal is connected to a chip connection terminal by wirings, the chip connection terminals are mutually connected by wirings, or these mutually connected chip connection terminals are further connected to a base connection terminal by wirings, a probe card is contacted with only pads for mounting ICs formed on the base substrate in which a turned-on electricity inspecting diode is incorporated and goodness or badness of wirings on the base substrate is judged from a measured value of a current flowing through the diode, the inspection of the base substrate including the turned-on electricity inspecting diode can be carried out by contacting probes of the probe card only onto pads of the peripheral part of the base substrate. Therefore, it is possible to judge an existence of a wiring default of the base substrate and a kind thereof from a measured result of a current flowing through the diode.

In an inspecting method for the base substrate of MCM in accordance with the present invention, a diode connected between an IC bonding pad formed on the base substrate and a node to be a predetermined voltage as a ground node or a power supply voltage node is produced in the base substrate. Therefore, it is possible to suppress an increase in cost for producing the base substrate due to providing the inspecting functions.

In the base substrate of MCM in accordance with the present invention, a short-circuiting wiring is provided so as to make a plurality of wiring patterns formed on the base substrate as a group of wiring patterns electrically connected with each other, and the short-circuiting wirings are provided such that a fuse pattern constituting the short-circuiting wiring has a narrower portion and an aperture is provided at a portion of a protecting layer or an insulating layer provided on the fuse pattern, which portion corresponding to the narrower portion, to enable the fuse pattern to be cut after the inspecting the base substrate. Therefore, the group of the plurality of wiring patterns which are electrically connected with each other can be tested as one unit and the number of pins of the probe card can be largely reduced.

In addition, in the base substrate of MCM in accordance with the present invention, a short-circuiting wiring pattern is provided at a part of the base substrate which is deleted in a dicing process and a process for cutting the fuse part of the short-circuiting wiring with such as a laser is realized automatically by the dicing process. Therefore, a desired circuit is obtained without a special cutting off process of the short-circuiting wiring.

In an inspecting method for the base substrate of MCM in accordance with the present invention, a short-circuiting wiring is provided so as to make a plurality of wiring patterns formed on the base substrate as a group of wiring patterns electrically connected with each other, and the short-circuiting wirings are provided such that a fuse pattern constituting the short-circuiting wiring has a narrower portion and an aperture is provided at a portion of a protecting layer or an insulating layer provided on the fuse pattern, which portion corresponding to the narrower portion to enable the fuse pattern to be cut after the inspecting the base substrate, and current value of the wiring patterns is measured by contacting a probe card with a terminal at the end part of each group of wiring patterns. Therefore, the group of plural wiring patterns which are electrically connected with each other can be tested as one unit and the number of pins of the probe card can be largely reduced.

What is claimed is:

1. A base substrate on which a plurality of semiconductor IC chips is mounted, where the base substrate and IC chips are sealed in a package to constitute a multichip module, the improvement comprising:

diodes being disposed outside of the semiconductor IC chips, an end of each diode is connected to a chip bonding pad for connecting each IC chip with said base substrate, where said chip bonding pad is disposed on the base substrate; and the other end of each diode being connected to a node having a predetermined voltage, wherein said base substrate includes substrate bonding pads for connecting said base substrate to said package, wirings for connecting between said chip bonding pads and substrate bonding pads, said substrate bonding pads being provided in the peripheral of said base substrate and wirings for connecting said substrate bonding pads to said package.

2. The base substrate of the multichip module of claim 1, wherein said diodes are incorporated in said base substrate.

3. The base substrate of the multichip module of claim 1, wherein said node to be a predetermined voltage is a ground node.

4. The base substrate of the multichip module of claim 1, wherein an anode of each diode is connected to said node to be a predetermined voltage and a cathode of each diode is connected to each chip bonding pads.

5. The base substrate of the multichip module of claim 1, wherein said node to be a predetermined voltage is a power supply node.

6. The base substrate of the multichip module of claim 1, wherein a cathode of each diode is connected to said node to be a predetermined voltage and an anode of each diode is connected to each chip bonding pads.

7. The base substrate of the multichip module of claim 1, wherein said base substrate comprises a p-type semiconductor substrate including an n-type region at the surface of the base substrate and a p-type region other than the n-type region; and each of said diodes comprises a p-n junction between said n-type region and said p-type region.

8. The base substrate of the multichip module of claim 1, wherein said base substrate comprises an n-type semiconductor and each of said diodes comprises a p-n junction between a p-type region at the surface of said base substrate and an n-type region in the p-type region.

9. The base substrate of the multichip module of claim 1, wherein said base substrate comprises an n-type semiconductor substrate including a p-type region at the surface of the base substrate and an n-type region other than the p-type region and each of said diodes comprises a p-n junction between said p-type region and said n-type region.

* * * * *